US012696410B2

(12) United States Patent
Furuno

(10) Patent No.: US 12,696,410 B2
(45) Date of Patent: Jul. 28, 2026

(54) LOCK MECHANISM AND POWER SUPPLY DEVICE

(71) Applicant: Murata Manufacturing Co., Ltd., Nagaokakyo (JP)

(72) Inventor: Masataka Furuno, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 80 days.

(21) Appl. No.: 18/820,295

(22) Filed: Aug. 30, 2024

(65) Prior Publication Data

US 2024/0422932 A1 Dec. 19, 2024

Related U.S. Application Data

(63) Continuation of application No. PCT/JP2023/004429, filed on Feb. 9, 2023.

(30) Foreign Application Priority Data

Mar. 8, 2022 (JP) ................................. 2022-035463

(51) Int. Cl.
H05K 7/14 (2006.01)
H05K 7/12 (2006.01)

(52) U.S. Cl.
CPC ............. H05K 7/1412 (2013.01); H05K 7/12 (2013.01)

(58) Field of Classification Search
None
See application file for complete search history.

(56) References Cited

U.S. PATENT DOCUMENTS 6,801,435 B1* 10/2004 Su ...................... H05K 7/14325
361/732
2015/0208530 A1* 7/2015 Tsai ........................ G06F 1/187
403/321

(Continued)

FOREIGN PATENT DOCUMENTS

JP H04-53032 Y2 12/1992
JP 2003-133765 A 5/2003

(Continued)

OTHER PUBLICATIONS

International Search Report and Written Opinion mailed on May 16, 2023, received for PCT Application No. PCT/JP2023/004429, filed on Feb. 9, 2023, 08 pages including English Translation.

(Continued)

*Primary Examiner* — James Wu
*Assistant Examiner* — Christopher L Augustin
(74) *Attorney, Agent, or Firm* — XSENSUS LLP

(57) ABSTRACT

A lock mechanism is attachable to a rack-mountable exterior body for housing an electronic device, and includes a latch and a bumper. The latch has a first flat plate and a first protrusion). The first flat plate has a main surface. The first protrusion protrudes from the first flat plate to a side that the main surface faces. The bumper has a second flat plate in contact with the latch and a second protrusion. The second protrusion protrudes from the second flat plate to a side in the same direction as the first protrusion. A specific axis parallel to the main surface is a first axis, and an axis orthogonal to the first axis and parallel to the main surface is a second axis. The first protrusion has a latch surface perpendicular to the first axis. The second protrusion has a bumper surface perpendicular to the second axis.

17 Claims, 4 Drawing Sheets

(56)          References Cited

U.S. PATENT DOCUMENTS

| | | | | |
|---|---|---|---|---|
| 2021/0132667 | A1* | 5/2021 | Wong ..................... | G06F 1/183 |
| 2021/0176881 | A1* | 6/2021 | Lin ...................... | H05K 5/0221 |
| 2022/0174837 | A1* | 6/2022 | Antaran .............. | H05K 7/1492 |
| 2022/0394867 | A1* | 12/2022 | Chang .................... | G06F 1/183 |

FOREIGN PATENT DOCUMENTS

| | | |
|---|---|---|
| JP | 2005-197536 A | 7/2005 |
| JP | 2018-164038 A | 10/2018 |

OTHER PUBLICATIONS

Office Action issued on Oct. 28, 2025, in corresponding Japanese patent Application No. 2024-505972, 7 pages.

\* cited by examiner

LOCK MECHANISM AND POWER SUPPLY DEVICE

CROSS-REFERENCE TO RELATED APPLICATIONS

This application is a continuation of international application no. PCT/JP2023/004429, filed Feb. 9, 2023, which claims priority to Japanese application no. 2022-035463, filed Mar. 8, 2022. The entire contents of both prior applications are hereby incorporated by reference.

TECHNICAL FIELD

The present disclosure relates to a lock mechanism used for a rack and a power supply device.

BACKGROUND ART

Patent Document 1 discloses a lock structure for fixing an electronic unit to a rack. The lock structure has an exterior body for the electronic unit, and a latch fixed to the exterior body. The exterior body has a substantially rectangular box shape. A side wall of the exterior body has a through-hole. The latch is a single flat plate. The latch is folded a plurality of times. As a result, the latch has a protruding portion that protrudes with respect to other portion. The latch is fixed to an inner surface of the side wall of the exterior body. In a state where the latch is fixed to the exterior body, the protruding portion of the latch protrudes outward from the through-hole of the exterior body. The protruding portion is received by a side of the rack, and thus the electronic unit is fixed to the rack.

CITATION LIST

Patent Document

Patent Document 1: Japanese Unexamined Patent Application Publication No. 2005-197536

SUMMARY

Technical Problems

As recognized by the present inventor when the electronic unit as described in Patent Document 1 is transported or the like in a state of being fixed to the rack, vibration and impact are applied to the electronic unit from outside. At this time, vibration and impact in various directions may be applied to the electronic unit. In the lock structure described in Patent Document 1, vibration and impact in various directions are applied to the protruding portion of the lock mechanism. Thus, there is a risk that the shape of the lock mechanism is distorted by the vibration, impact, and the like.

Solutions to Problems

In order to solve the above-described and other problems, the present disclosure provides a lock mechanism attachable to a rack-mountable exterior body for housing an electronic device. The lock mechanism includes a latch and a bumper. The latch has a first flat plate and a first protrusion. The first flat plate has a main surface, and the first protrusion protrudes from the first flat plate to a side that the main surface faces. The bumper has a second flat plate and a second protrusion. The second flat plate is in contact with the latch, and the second protrusion protrudes from the second flat plate to a side in the same direction as the first protrusion. Under conditions that a specific axis parallel to the main surface is a first axis, and an axis orthogonal to the first axis and parallel to the main surface is a second axis, the first protrusion has a latch surface perpendicular to the first axis, and the second protrusion has a bumper surface perpendicular to the second axis.

According to the above-described configuration, when the lock mechanism is attached to the exterior body, the latch surface of the latch can restrict the exterior body that is about to move along the first axis. In addition, the bumper surface of the bumper can restrict the exterior body that is about to move along the second axis. In this way, the movements in the two orthogonal directions can be restricted by the different members in a distributed manner. Thus, it is possible to prevent occurrence of deformation or the like in the lock mechanism. Further, the latch and the bumper are in contact with each other, and thus can mutually suppress deformation.

Advantageous Effects

According to an aspect of the present disclosure, it is possible to suppress distortion of the shape of the lock mechanism.

DESCRIPTION OF EMBODIMENTS

Hereinafter, an embodiment of a lock mechanism, and a power supply device including the lock mechanism and a rack will be described. Note that in the accompanying drawings, components may be illustrated in an enlarged manner for facilitating understanding. In addition, dimensional ratios of the components may be different from those of actual components or those in other drawings.

<About Lock Mechanism>

Figure 1:
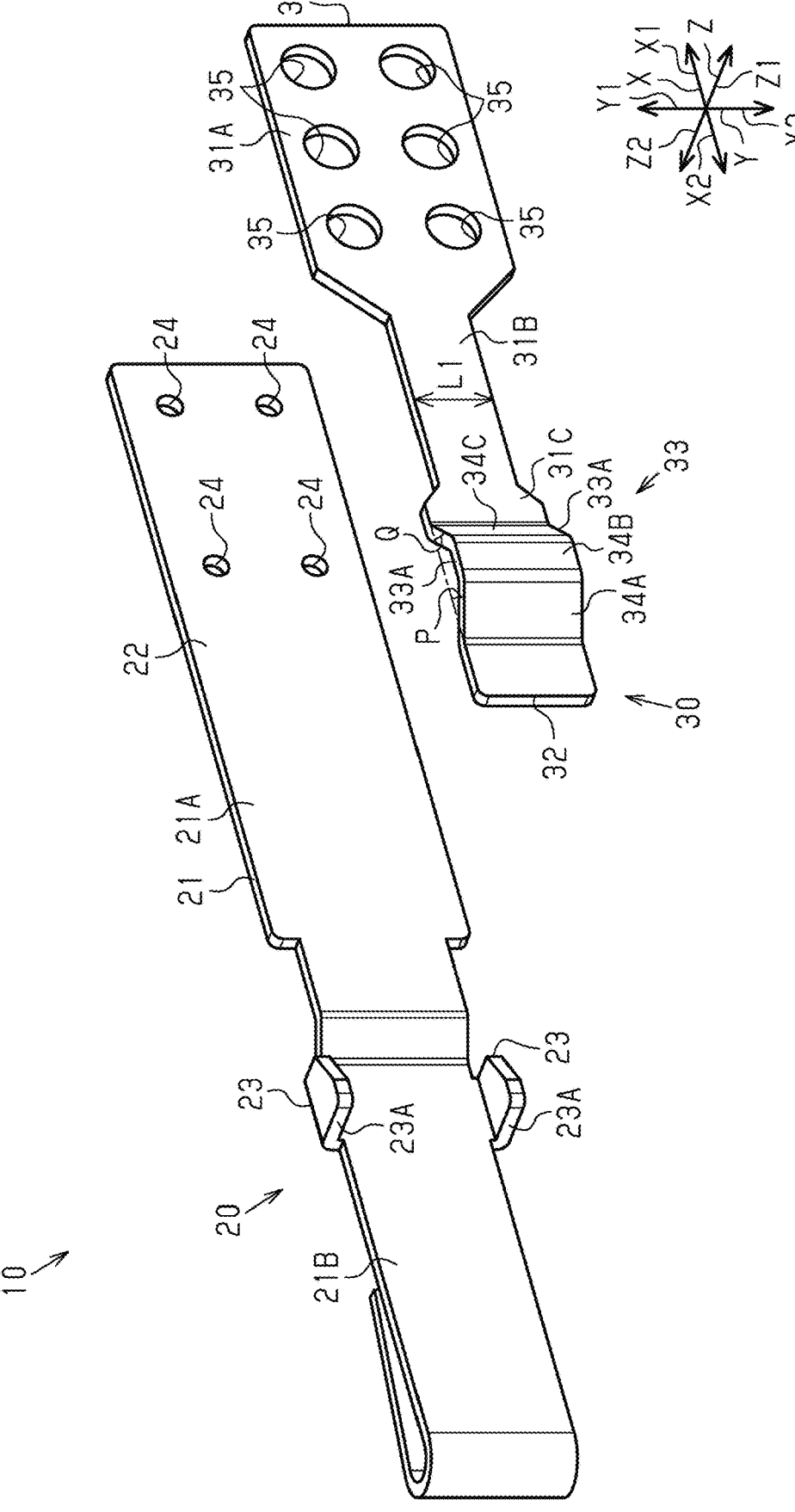
FIG. 1 is an exploded perspective view of a lock mechanism.
Figure 4:
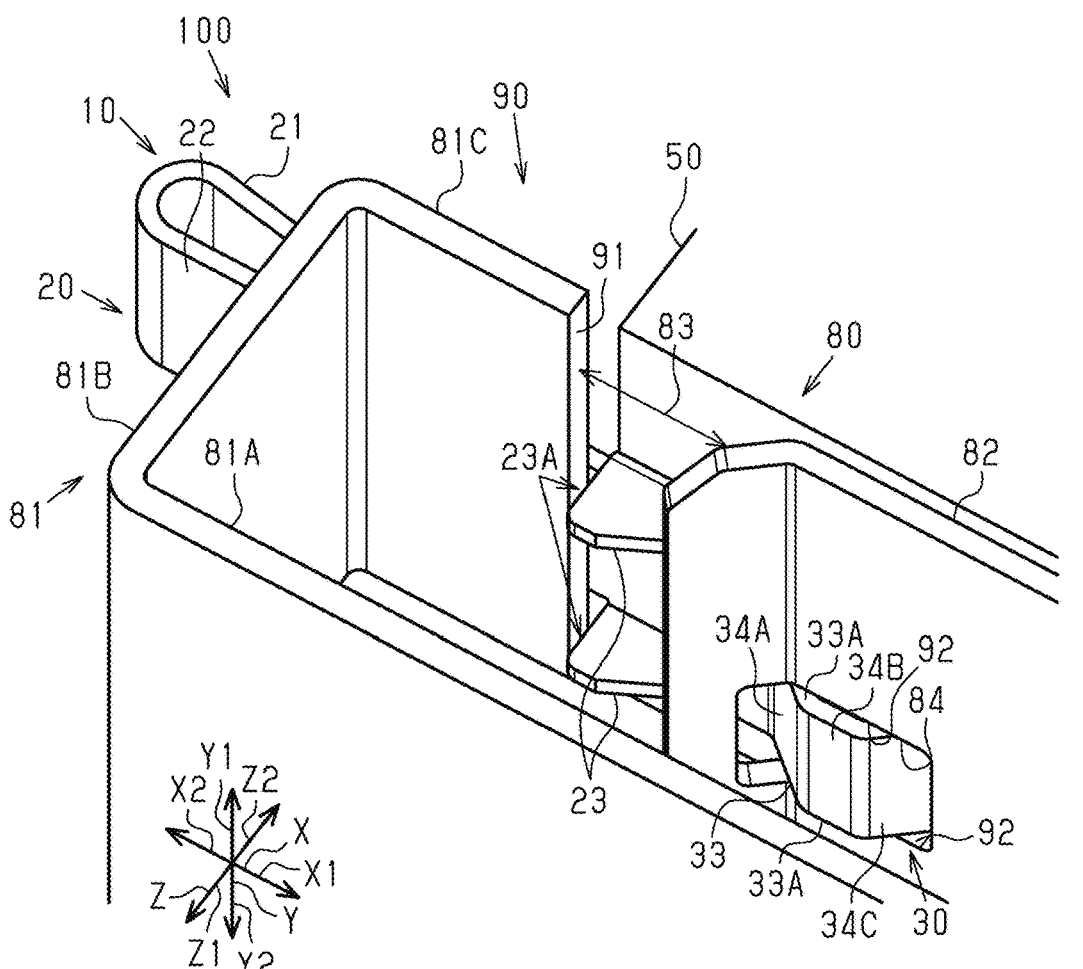
FIG. 4 is a diagram of a state in which the exterior body is fixed to a rack via the lock mechanism.

As illustrated in FIG. 1 and FIG. 4, a lock mechanism 10 of a power supply device 100 includes a latch 20 and a bumper 30. As illustrated in FIG. 1, the latch 20 has a first flat plate 21 and two first protrusions 23.

The first flat plate 21 has a substantially flat plate shape. The first flat plate 21 has a main surface 22. The main surface 22 has a substantially rectangular shape in plan view. Note that a "main surface" is, among outer surfaces of a plate-shaped object, a surface having a largest area or a surface facing in an opposite direction of the surface having the largest area.

Here, a specific axis parallel to the main surface 22 is a first axis X. Additionally, an axis orthogonal to the first axis X and parallel to the main surface 22 is a second axis Y. In the present embodiment, the first axis X is an axis along a longitudinal direction of the main surface 22. The second axis Y is an axis along a lateral direction of the main surface 22. Additionally, an axis orthogonal to both the first axis X and the second axis Y is a third axis Z. Note that one of two directions along the first axis X is a first positive direction X1, and an opposite direction to the first positive direction X1 is a first negative direction X2. Further, one of two directions along the second axis Y is a second positive direction Y1, and an opposite direction to the second positive direction Y1 is a second negative direction Y2. Further, one of two directions along the third axis Z is a third positive direction Z1, and an opposite direction to the third positive direction Z1 is a third negative direction Z2. Note that in the present embodiment, the main surface 22 of the latch 20 is a surface facing in the third positive direction Z1.

The first flat plate 21 has a first portion 21A and a second portion 21B. The first portion 21A is a portion from an end of the first flat plate 21 on a side in the first positive direction X1 to a substantially center of the first flat plate 21. The first portion 21A is constant in dimension in a direction along the second axis Y. The second portion 21B is a portion having a span that is the same as that of the first portion 21A although excluding the first portion(s) 21A from the first flat plate 21. The second portion 21B is constant in dimension in the direction along the second axis Y. Further, a dimension of the second portion 21B in the direction along the second axis Y is smaller than a dimension of the first portion 21A in the direction along the second axis Y. Thus, steps are generated at a boundary between the first portion 21A and the second portion 21B. Note that a minimum dimension among dimensions of the first flat plate 21 in the direction along the second axis Y is the dimension of the second portion 21B in the direction along the second axis Y. A portion of the second portion 21B is folded back such that a tip end thereof faces in the first positive direction X1. A material of the first flat plate 21 is metal. Specifically, the material of the first flat plate 21 is stainless steel.

The two first protrusions 23 protrude from the second portion 21B. The two first protrusions 23 are located away from each other in the direction along the second axis Y.

One of the first protrusions 23 protrudes from a side surface of the first flat plate 21 on a side in the second positive direction Y1 to a side that the main surface 22 faces. The other of the first protrusions 23 protrudes from a side surface of the first flat plate 21 on a side in the second negative direction Y2 to the side that the main surface 22 faces. That is, each first protrusion 23 protrudes to a side in the third positive direction Z1. Moreover, each first protrusion 23 rises perpendicularly with respect to the plane in which main surface 22 is located.

Each first protrusion 23 has a substantially trapezoidal shape when viewed in the direction along the second axis Y. The two first protrusions 23 face each other in the direction along the second axis Y. The two first protrusions 23 have shapes symmetrical in the direction along the second axis Y. Further, each first protrusion 23 has a latch surface 23A perpendicular to the first axis X. In the present embodiment, the latch surface 23A is a surface among outer surfaces of the first protrusion 23 that faces a side in the first negative direction X2. The two first protrusions 23 are integrally formed with the first flat plate 21. Note that as the state in which the latch surface 23A is perpendicular to the first axis X, in addition to a case of being completely perpendicular, a state where a slight deviation from perpendicular is also acceptable as a consequence of manufacturing tolerances and the like.

The first portion 21A of the first flat plate 21 has four through-holes 24. Each through-hole 24 is a fixing portion for fixing the latch 20 to an exterior body 50 described later. Note that as described above, each first protrusion 23 protrudes from the second portion 21B, such as from an edge of the second portion 21B. Thus, each through-hole 24 is located on the side in the first positive direction X1 with respect to the first protrusion 23. Two through-holes among the four through-holes 24 are located at an end portion of the first flat plate 21 on the side in the first positive direction X1. These two through-holes 24 are arranged along the second axis Y, at the same position in a direction along the first axis X. Further, the remaining two through-holes 24 are located on the side in the first negative direction X2 when viewed from the above-described two through-holes 24. The two through-holes 24 are also arranged along the second axis Y at the same position in the direction along the first axis X.

As illustrated in FIG. 1, the bumper 30 has a plate shape that is elongated in the direction along the first axis X. The bumper 30 is located on a side of the main surface 22 of the latch 20. The bumper 30 has a second flat plate 31 and a bumper portion 32.

Figure 2:
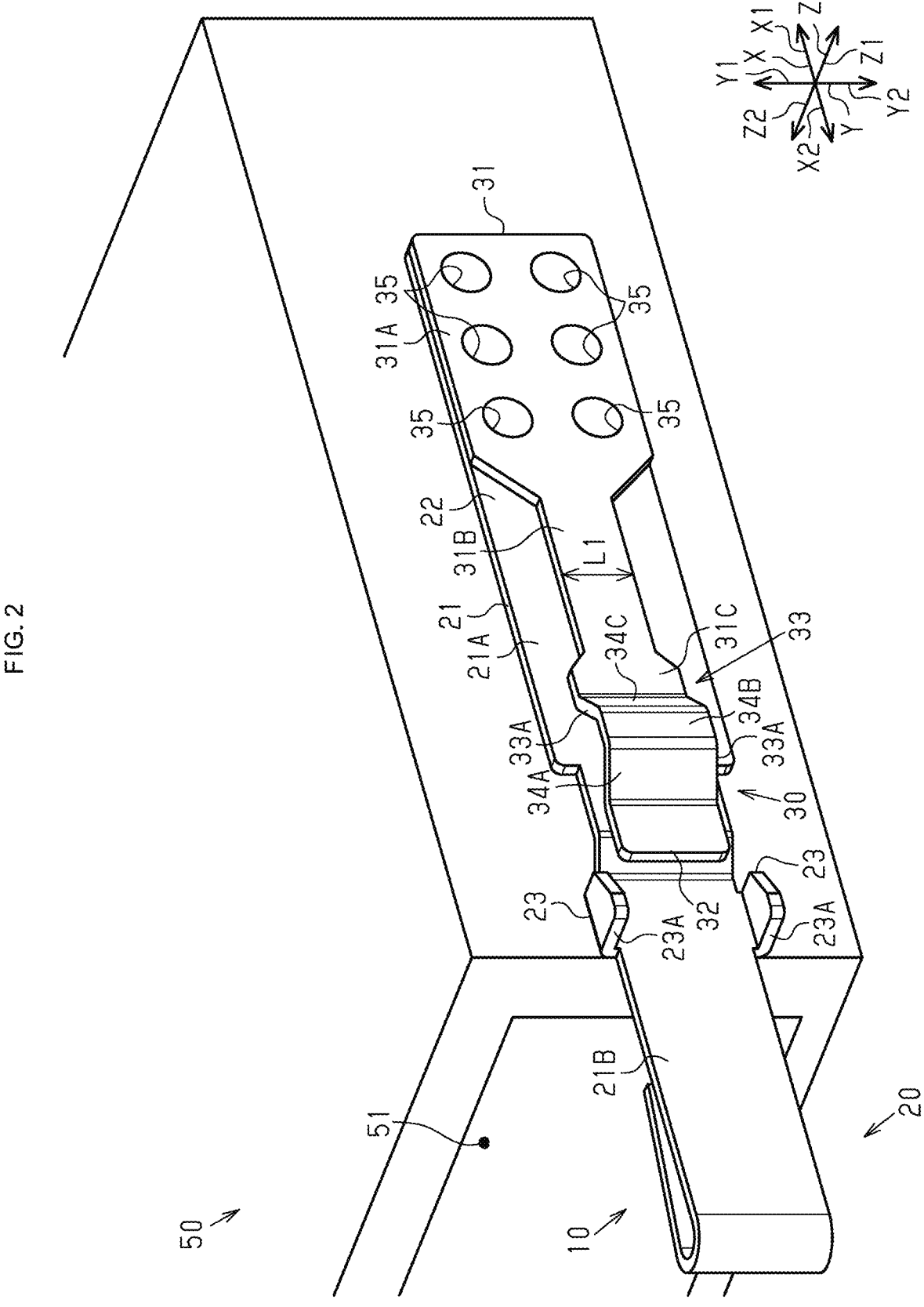
FIG. 2 is a perspective view of the lock mechanism and an exterior body.

The second flat plate 31 has a flat plate shape. As illustrated in FIG. 2, the second flat plate 31 is overlaid on the latch 20 on the side of the main surface 22. That is, the second flat plate 31 is in contact with the latch 20. As illustrated in FIG. 1, the second flat plate 31 has a base end portion 31A, a narrow portion 31B, and a tip end portion 31C. The base end portion 31A is a portion including an end of the second flat plate 31 on the side in the first positive direction X1. The base end portion 31A is constant in dimension in the direction along the second axis Y. Additionally, a dimension of the base end portion 31A in the direction along the second axis Y is the same as the dimension of the first portion 21A of the first flat plate 21 in the direction along the second axis Y.

The narrow portion 31B is a portion extending from an end of the base end portion 31A on the side in the first negative direction X2. A dimension of the narrow portion 31B in the direction along the second axis Y is smaller than the dimension of the base end portion 31A in the direction along the second axis Y. A minimum dimension among the dimensions of the narrow portion 31B in the direction along the second axis Y is approximately half the dimension of the base end portion 31A in the direction along the second axis Y.

The tip end portion 31C is a portion extending from an end of the narrow portion 31B on the side in the first negative direction X2. A dimension of the tip end portion 31C in the direction along the second axis Y is smaller than the dimension of the base end portion 31A in the direction along the second axis Y. Additionally, the dimension of the tip end portion 31C in the direction along the second axis Y is larger than the dimension of the narrow portion 31B in the direction along the second axis Y.

Figure 3:
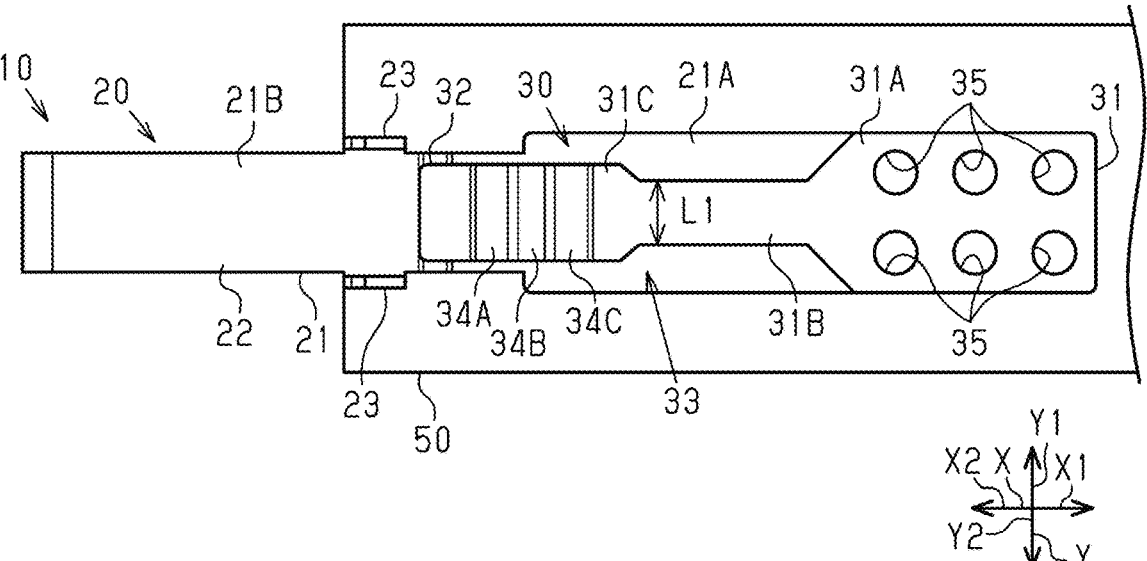
FIG. 3 is a front view of the lock mechanism and the exterior body.

As illustrated in FIG. 3, the dimension of the narrow portion 31B in the direction along the second axis Y is smaller than the minimum dimension of the first flat plate 21 of the latch 20 in the direction along the second axis Y. Thus, a minimum dimension Li of the second flat plate 31 in the direction along the second axis Y is smaller than the minimum dimension of the first flat plate 21 in the direction along the second axis Y. As a result, for equal thickness stock, a bending rigidity of the bumper 30 is smaller than a bending rigidity of the latch 20.

Note that it is sufficient that the bending rigidity of each of the latch 20 and the bumper 30 is measured by the following three-point bending test. That is, both ends of the latch 20 or the bumper 30 as a test target are supported from below. Then, in this state, a downward load is applied to a center of the test target from above. Then, a load when a certain deformation occurs in the test target is measured. A bending rigidity is larger for a larger load measured in this way.

As illustrated in FIG. 1, the bumper portion 32 is connected to an end of the second flat plate 31 on the side in the first negative direction X2. That is, the bumper portion 32 is connected to an end of the tip end portion 31C on the side in the first negative direction X2. The bumper portion 32 has a plate shape. The bumper portion 32 is constant in dimension in the direction along the second axis Y. Further, a dimension of the bumper portion 32 in the direction along the second axis Y is the same as a dimension in the direction along the second axis Y at the end of the tip end portion 31C on the side in the first negative direction X2. A portion of the bumper portion 32 has a shape that is curved so as to project in the third positive direction Z1 when viewed in the direction along the second axis Y. As a result, the bumper portion 32 has a second protrusion 33 that protrudes to the side in the third positive direction Z1 when viewed from the second flat plate 31. That is, the second protrusion 33 protrudes to a side in the same direction as the first protrusion 23.

As illustrated in FIG. 2, the second protrusion 33 has a first inclined surface 34A, a second inclined surface 34C, and a parallel surface 34B as surfaces on the side in the third positive direction Z1.

The first inclined surface 34A is a surface among outer surfaces of the second protrusion 33, extending from an end on the side in the first negative direction X2. The first inclined surface 34A is a flat surface. The first inclined surface 34A is located farther on a side to which the second protrusion 33 protrudes, as the first inclined surface 34A extends in the first positive direction X1. That is, the first inclined surface 34A is located farther on the side in the third positive direction Z1, as the first inclined surface 34A extends in the first positive direction X1. As illustrated in FIG. 1, when viewed in the direction along the second axis Y, an acute angle P formed by the first inclined surface 34A and the first axis X is 30 degrees.

As illustrated in FIG. 2, the parallel surface 34B is connected to an end on the first inclined surface 34A on the side in the third positive direction Z1. The parallel surface 34B extends from the end of the first inclined surface 34A to the side in the first positive direction X1. The parallel surface 34B is a flat surface. The parallel surface 34B is parallel to the second flat plate 31.

The second inclined surface 34C extends from an end of the parallel surface 34B on the side in the first positive direction X1. The second inclined surface 34C is located farther in the third negative direction Z2, as the second inclined surface 34C extends in the first positive direction X1. An end of the second inclined surface 34C on the side in the third negative direction Z2 is connected to the second flat plate 31. Further, similarly, as illustrated in FIG. 1, when viewed in the direction along the second axis Y, an acute angle Q formed by the second inclined surface 34C and the first axis X is 30 degrees.

As illustrated in FIG. 2, the second protrusion 33 has two bumper surfaces 33A that extend away from the second axis Y (in X axis and Z axis directions which are perpendicular to the Y axis). One of the two bumper surfaces 33A is a surface among the outer surfaces of the second protrusion 33 that faces in the second positive direction Y1. The other of the two bumper surfaces 33A is a surface among the outer surfaces of the second protrusion 33 that faces in the second negative direction Y2. Note that, as in the case of the latch surface 23A, as the state in which the bumper surface 33A is perpendicular to the second axis Y (i.e., having at least one of X axis and/or Z axis components), in addition to a case of completely perpendicular, a state where a slight deviation from pure perpendicular is acceptable due to, for example, manufacturing tolerance.

The base end portion 31A of the second flat plate 31 has six through-holes 35. Each through-hole 35 is a fixing portion for fixing the bumper 30 to the exterior body 50 described later. Note that as described above, the second protrusion 33 is located on the side in the first negative direction X2 when viewed from the second flat plate 31. Thus, each through-hole 35 is located on the side in the first positive direction X1 when viewed from the second protrusion 33.

Two of the through-holes 35 are located at an end portion of the base end portion 31A on the side in the first positive direction X1. The two through-holes 35 are arranged along the second axis Y at the same position in the direction along the first axis X. Further, two of the remaining through-holes 35 are located on the side in the first negative direction X2 when viewed from the above-described two through-holes 35. The two through-holes 35 are also arranged along the second axis Y at the same position in the direction along the first axis X. Further, the last two through-holes 35 are located on the side in the first negative direction X2 when viewed from the above-described two through-holes 35. The two through-holes 35 are also arranged along the second axis Y at the same position in the direction along the first axis X.

<About Exterior Body>

As illustrated in FIG. 2, the exterior body 50 has a flat box shape. The exterior body 50 is for housing an electronic device. The exterior body 50 has a space 51 in which electronic components can be housed therein. Note that FIG. 2 illustrates only a part of the exterior body 50.

As illustrated in FIG. 3, the lock mechanism 10 is attached to a side surface of the exterior body 50 on the side in the third positive direction Z1 via a bolt (not illustrated) that penetrates the through-hole 24 and the through-hole 35. Specifically, the lock mechanism 10 is attached in a state where a surface of the latch 20 on an opposite side of the main surface 22 is in contact with the exterior body 50. That is, when viewed in the direction along the second axis Y, the bumper 30 is located on the opposite side of the latch 20 from the exterior body 50.

In a state where the lock mechanism 10 is fixed to the exterior body 50, when viewed in the direction along the third axis Z, an end of the latch 20 on the side in the first negative direction X2 is located farther on the side in the first negative direction X2 than an end of the exterior body 50 on the side in the first negative direction X2. In other words, a portion of the latch 20 protrudes in the first negative direction X2 with respect to the exterior body 50. In addition, in the state where the lock mechanism 10 is fixed to the exterior body 50, an end of the bumper 30 on the side in the first negative direction X2 is located farther on the side in the first positive direction X1 than the end of the exterior body 50 on the side in the first negative direction X2. Further, the end of the bumper 30 on the side in the first negative direction X2 is located on the side in the first positive direction X1 when viewed from the first protrusion 23 of the latch 20.

<About Rack>

As illustrated in FIG. 4, the exterior body 50 can be attached to a rack 80 via the lock mechanism 10. The rack 80 of the power supply device 100 is a frame for housing the exterior body 50. In FIG. 4, only a part of the rack 80 is illustrated.

The rack 80 has a flat plate portion 90. The flat plate portion 90 is a portion that faces the lock mechanism 10 and at least partially comes into contact with the lock mechanism 10 in a state where the lock mechanism 10 is fixed to the rack 80. Further, the flat plate portion 90 includes a first member 81 and a second member 82. The first member 81 has a first wall portion 81A, a second wall portion 81B, and a third wall portion 81C.

The first wall portion 81A is parallel to the first axis X and the second axis Y. A dimension of the first wall portion 81A in the direction along the first axis X is larger than a dimension of the exterior body 50 in the direction along the first axis X. An end of the first wall portion 81A on the side in the first negative direction X2 is connected to the second wall portion 81B.

The second wall portion 81B is located on the side in the third negative direction Z2 when viewed from the first wall portion 81A. The second wall portion 81B is parallel to the third axis Z and the second axis Y. An end of the second wall portion 81B on the side in the third negative direction Z2 is connected to the third wall portion 81C.

The third wall portion 81C is located on the side in the first positive direction X1 when viewed from the second wall portion 81B. The third wall portion 81C is parallel to the first axis X and the second axis Y. That is, the third wall portion 81C is parallel to the first wall portion 81A. A dimension of the third wall portion 81C in the direction along the first axis X is shorter than the dimension of the first wall portion 81A in the direction along the first axis X. The first wall portion 81A, the second wall portion 81B, and the third wall portion 81C are integrally formed. That is, the first member 81 has a shape obtained by bending a flat plate at 90 degrees twice. A dimension of the first member 81 in the direction along the second axis Y is larger than a dimension of the exterior body 50 in the direction along the second axis Y.

The second member 82 is a flat plate parallel to the first axis X and the second axis Y as a whole. A dimension of the second member 82 in the direction along the second axis Y is the same as the dimension of the first member 81 in the direction along the second axis Y. Most of the second member 82 is parallel to the first axis X and the second axis Y. Most of the second member 82 is located on the same plane as the third wall portion 81C of the first member 81. The second member 82 is located on the side in the first positive direction X1 with respect to the third wall portion 81C. The second member 82 is located at a position spaced apart from the third wall portion 81C by a gap 83 in the direction along the first axis X. In other words, the flat plate portion 90 has the gap 83 as a first opening. Then, the gap 83 as the first opening extends in the direction along the second axis Y. Further, the second member 82 faces the first wall portion 81A. An end portion of the second member 82 on the side in the first negative direction X2 is bent so as to extend toward the side in the third positive direction Z1 as the end portion extends in the first negative direction X2.

The second member 82 has a through-hole 84 as a second opening at the end portion on the side in the first negative direction X2. The through-hole 84 has a quadrangular shape elongated in the direction along the first axis X when viewed in the direction along the third axis Z. That is, the through-hole 84 as the second opening extends in the direction along the first axis X. A portion of the through-hole 84 on the side in the first negative direction X2 is located at a bent portion of the second member 82. A dimension of the through-hole 84 in the direction along the first axis X is slightly larger than a dimension of the second protrusion 33 of the bumper 30 in the direction along the first axis X. A dimension of the through-hole 84 in the direction along the second axis Y is slightly larger than a dimension of the second protrusion 33 of the bumper 30 in the direction along the second axis Y.

When the lock mechanism 10 is fixed to the rack 80, the second protrusion 33 of the bumper 30 is received into the through-hole 84 of the second member 82. Here, two surfaces perpendicular to the second axis Y among inner surfaces of the opening of the through-hole 84 are second surfaces 92. The two second surfaces 92 are separated from each other in the direction along the second axis Y. Further, the two second surfaces 92 face each other. In a state where the second protrusion 33 is received into the through-hole 84, the bumper surface 33A facing in the second positive direction Y1 is in contact with the second surface 92 of an opening edge of the through-hole 84 facing in the second negative direction Y2. In addition, in the state where the second protrusion 33 is received into the through-hole 84, the bumper surface 33A facing in the second negative direction Y2 is in contact with the second surface 92 of the opening edge of the through-hole 84 facing in the second positive direction Y1.

Further, when the lock mechanism 10 is fixed to the rack 80, the first protrusion 23 of the latch 20 is located in the gap 83 between the second member 82 and the third wall portion 81C. Here, a surface among inner surfaces of the gap 83, which is perpendicular to the first axis X, and faces in the first positive direction X1, is a first surface 91. In a state where the first protrusion 23 is located in the gap 83, the latch surface 23A of the first protrusion 23 is in contact with the first surface 91.

Operation of Present Embodiment

When the exterior body 50 is fixed to the rack 80, a surface of the exterior body 50 on which the lock mechanism 10 is located, and a surface of the rack 80 on which the first member 81 and the second member 82 are arranged are disposed so as to face each other. Then, the exterior body 50 is pushed in the first positive direction X1 with a side of the exterior body 50 in the first positive direction X1 as a head, and thus the exterior body 50 is housed in the rack 80.

When the exterior body 50 is housed in the rack 80, the second protrusion 33 of the bumper 30 moves while being in contact with the first member 81 and the second member 82 of the rack 80. Note that during the movement, the second protrusion 33 may be pressed by the first member 81 and the second member 82, and elastically deformed to the side in the third negative direction Z2. The second protrusion 33 is received into the through-hole 84 (by a resilient force opposite in direction to the force causing the elastic deformation) in a state where the second inclined surface 34C of the second protrusion 33 is in contact with a surface of the opening edge of the through-hole 84 that faces the side in the first negative direction X2. In this state, when the exterior body 50 is about to move in the direction along the second axis Y, the bumper surface 33A of the second protrusion 33 collides with the second surface 92 of the through-hole 84.

That is, the second protrusion 33 of the bumper 30 restricts the movement of the exterior body 50 in the direction along the second axis Y.

Further, when the exterior body 50 is housed in the rack 80, the first protrusion 23 of the latch 20 moves while sliding on a surface of the first member 81 of the rack 80. When the first protrusion 23 is located in the gap 83 between the first member 81 and the second member 82, the latch surface 23A of the first protrusion 23 comes into contact with the first surface 91. In this state, when the exterior body 50 is about to jump out from the rack 80, the latch surface 23A is restricted by the third wall portion 81C. That is, the first protrusion 23 of the latch 20 restricts the exterior body 50 so as not to jump out from the rack 80 to the side in the first negative direction X2.

Effects of Present Embodiment (1) According to the above-described embodiment, when the lock mechanism 10 is attached to the exterior body 50, the latch surface 23A of the latch 20 can restrict the exterior body 50 that is about to move along the first axis X. In addition, the bumper surface 33A of the bumper 30 can restrict the exterior body 50 that is about to move along the second axis Y. In this way, the lock mechanism 10 can restrict the movements along the two axes orthogonal to each other by the different members in a distributed manner. Thus, the lock mechanism 10 can be prevented from being deformed, or the like. Further, the latch 20 and the bumper 30 are in contact with each other, and thus can mutually suppress deformation.

(2) According to the above-described embodiment, a portion of the first flat plate 21 protrudes with respect to the end of the bumper 30 on the side in the first negative direction X2 to the side in the first negative direction X2. The latch 20 can be removed from the rack 80 by gripping the protruding portion of the first flat plate 21 and warping (bending) a portion of the first flat plate 21 to the side in the third negative direction Z2.

(3) In the above-described embodiment, the end of the latch 20 on the side in the first negative direction X2 is located farther on the side in the first negative direction X2 than the end of the exterior body 50 on the side in first negative direction X2. That is, an end portion of the latch 20 in the first negative direction X2 protrudes with respect to the exterior body 50. A portion of the latch 20 protruding with respect to the exterior body 50 is not fixed and is likely to vibrate. When vibration and impact are applied to the lock mechanism 10, the protruding portion vibrates, and thus kinetic energy thereof is consumed. Thus, large vibration is less likely to occur in a portion other than the protruding portion of the latch 20. That is, a portion of the latch 20 functions as a dynamic damper.

(4) According to the above-described embodiment, when the bumper 30 is moved in the first negative direction X2, the first inclined surface 34A of the bumper 30 comes into contact with the opening edge of the through-hole 84. Then, when the bumper 30 is further moved in the first negative direction X2, force heading to the side in the third negative direction Z2 acts on the first inclined surface 34A of the bumper 30. This force can displace the second protrusion 33 in a direction opposite to the direction in which the second protrusion 33 protrudes. Thus, the fitting relationship between the second protrusion 33 and the through-hole 84 is easily released. Note that the bumper 30 restricts the movement of the exterior body 50 in the direction along the second axis Y. Thus, even when the engagement relationship is easily released when the bumper 30 moves in the first negative direction X2, there is no particular problem.

(5) According to the above-described embodiment, the first protrusion 23 is easily deformed by force in the direction along the second axis Y, but is not easily deformed by force in the direction along the first axis X. Such a first protrusion 23 has the latch surface 23A, thus deformation of the first protrusion 23 when the force in the direction along the first axis X acts on the latch surface 23A can be suppressed.

(6) According to the above-described embodiment, the bumper 30 is located outside the latch 20 when viewed in the direction along the second axis Y. As a result, when the lock mechanism 10 is fixed to the rack 80, the bumper 30 is sandwiched between the latch 20 and the rack 80. That is, in the state where the lock mechanism 10 is fixed to the rack 80, the bumper 30 is supported by the latch 20 and the rack 80, and thus is less likely to be deformed.

(7) In the above-described embodiment, when the exterior body 50 is removed from the rack 80, the second protrusion 33 of the bumper 30 comes into contact with the through-hole 84 or the like of the rack 80. That is, when the exterior body 50 is removed from the rack 80, a load is applied to the bumper 30. In the above-described embodiment, the bending rigidity of the bumper 30 is smaller than the bending rigidity of the latch 20. That is, the bumper 30 is more easily warped than the latch 20. Thus, even when a load is applied to the second protrusion 33, the bumper 30 is warped, and thus it is possible to suppress irreversible deformation of the bumper 30, cracking of the bumper 30, and the like.

Modifications

The above-described embodiment can be modified and implemented as follows. The above-described embodiment and the following modifications can be implemented in combination with each other as long as no technical inconsistency occurs.

In the above-described embodiment, the lock mechanism 10 may have another flat plate in addition to the latch 20 and the bumper 30. For example, the lock mechanism 10 may further have a flat plate that is overlaid on a surface of the bumper 30 on the side in the third positive direction Z1.

Figure 5:
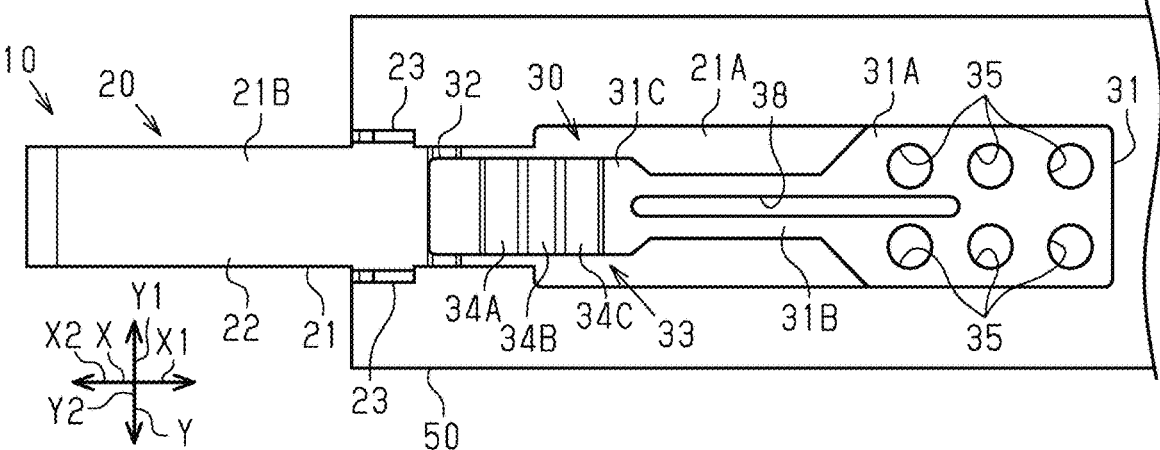
FIG. 5 is a front view of a lock mechanism of a modification.

In the above-described embodiment, the bumper 30 may have a slit that extends through the second flat plate 31. In an example illustrated in FIG. 5, the bumper 30 has a slit 38 extending through the second flat plate 31 in the third axis Z direction. The slit 38 extends parallel to the first axis X. The slit 38 is located on the side in the first positive direction X1 when viewed from the second protrusion 33. The slit 38 is located at a center of the second flat plate 31 in the direction along the second axis Y.

In this way, when the bumper 30 has the slit 38, the bending rigidity of the bumper 30 is smaller than that in a case where the bumper 30 does not have the slit 38. Such a bumper 30 is more easily warped than the bumper 30 of the above-described embodiment. Thus, even when a load is applied to the second protrusion 33, the bumper 30 is warped, and thus it is possible to suppress irreversible deformation of the bumper 30 due to the load.

In the above-described embodiment, the second flat plate 31 of the bumper 30 may have a thin portion that is partially smaller in dimension in the direction along the third axis Z than other portions. Further, it is preferable that such a thin portion be located on the side in the first positive direction X1 of the second flat plate 31 when viewed from the second protrusion 33. Even in this case, the bending rigidity of the bumper 30 can be reduced in the thin portion.

In the above-described embodiment, a dimension of the second flat plate 31 of the bumper 30 in the direction along the second axis Y may be constant regardless of position in the direction along the first axis X. This similarly applies to the first flat plate 21, and a dimension in the direction along the second axis Y may be constant regardless of position in the direction along the first axis X.

In the above-described embodiment, the minimum dimension Li of the second flat plate 31 in the second axis Y may be larger than the minimum dimension of the first flat plate 21 in the direction along the second axis Y. In addition, the minimum dimension Li of the second flat plate 31 in the second axis Y may be the same as the minimum dimension of the first flat plate 21 in the direction along the second axis Y.

In the above-described embodiment, a dimension of the first flat plate 21 in the direction along the first axis X may be smaller than or equal to that of the second flat plate 31 in the direction along the first axis X.

In the above-described embodiment, in the state where the lock mechanism 10 is fixed to the exterior body 50, the end of the latch 20 on the side in the first negative direction X2 need not protrude with respect to the end of the exterior body 50 on the side in the first negative direction X2.

In the above-described embodiment, in the state where the lock mechanism 10 is fixed to the exterior body 50, the end of the bumper 30 on the side in the first negative direction X2 may protrude with respect to the end of the exterior body 50 on the side in the first negative direction X2.

In the above-described embodiment, the latch 20 and the bumper 30 may be made of any material. For example, the material of the latch 20 and the bumper 30 may be a synthetic resin.

Figure 6:
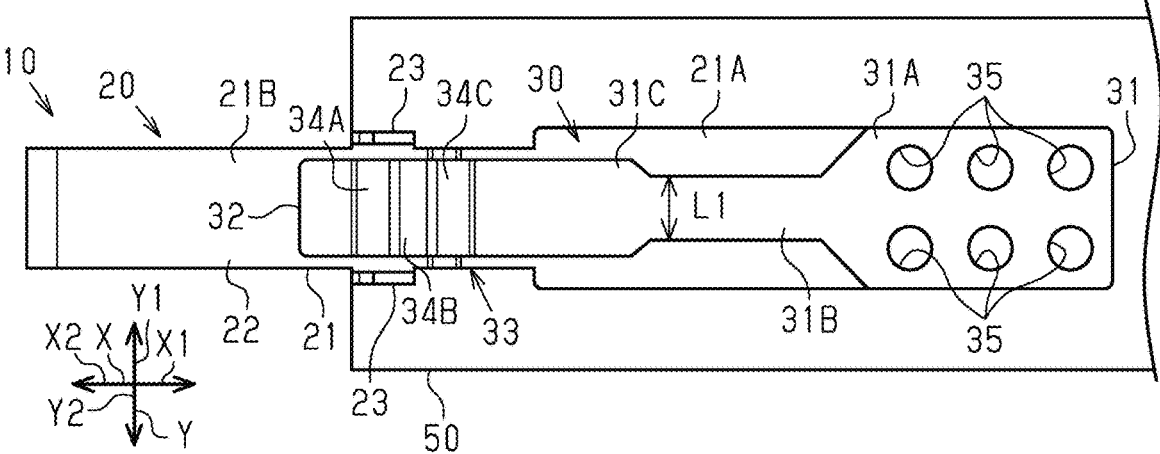
FIG. 6 is a front view of a lock mechanism of a modification.

In the above-described embodiment, a position of the second protrusion 33 of the bumper 30 in the direction along the first axis X may be different from that in the example of the above-described embodiment. For example, in an example illustrated in FIG. 6, the second protrusion 33 may be located between the two first protrusions 23 in the direction along the second axis Y. According to this configuration, even when the first protrusions 23 are about to be deformed in a direction in which the first protrusions 23 approach each other, the deformation is restricted by the second protrusion 33. Thus, according to this configuration, it is possible to suppress the deformation of the first protrusions 23.

Figure 7:
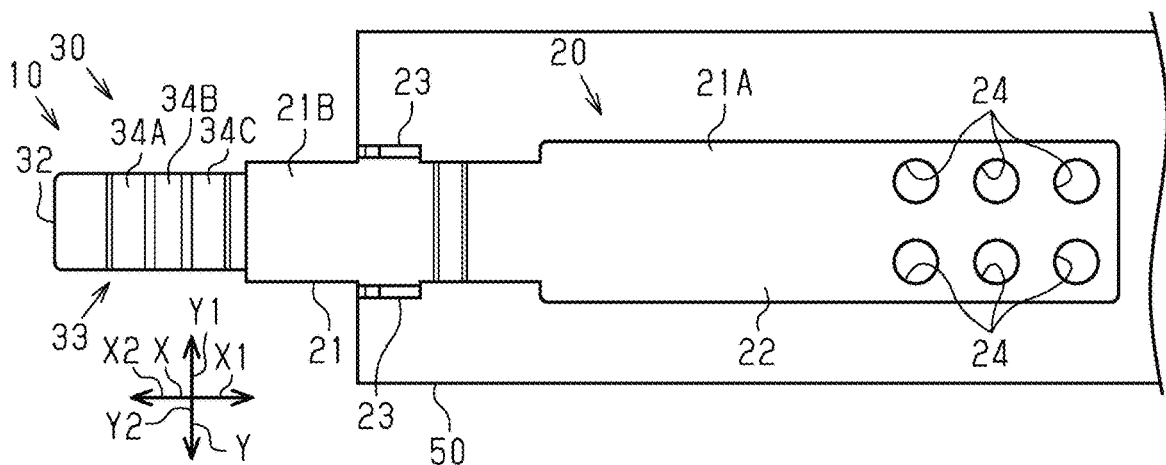
FIG. 7 is a front view of a lock mechanism of a modification.

In the above-described embodiment, the bumper 30 may be overlaid on a side of a surface of the first flat plate 21 opposite to the main surface 22 in the latch 20. That is, the bumper 30 may be in contact with the latch 20 on the side opposite to the main surface 22 of the first flat plate 21. In other words, as in an example illustrated in FIG. 7, the bumper 30 and the latch 20 may be overlaid in this order on the exterior body 50. In the example illustrated in FIG. 7, the second protrusion 33 of the bumper 30 is located on the side in the first negative direction X2 when viewed from the first protrusion 23 of the latch 20. According to this configuration, when the lock mechanism 10 is fixed to the rack 80, the latch 20 is sandwiched between the bumper 30 and the rack 80. That is, in the state where the lock mechanism 10 is fixed to the rack 80, the latch 20 is less likely to be distorted.

In the above-described embodiment, the bending rigidity of the bumper 30 may be larger than the bending rigidity of the latch 20. Further, the bending rigidity of the bumper 30 may be the same as the bending rigidity of the latch 20.

However, the bending rigidity of the bumper 30 is preferably such that the bumper 30 is not irreversibly deformed when the engagement relationship with the rack 80 is released.

In the above-described embodiment, the first protrusion 23 may protrude from the main surface 22 of the first flat plate 21.

In the above-described embodiment, the number of the first protrusions 23 may be one, or three or more.

In the above-described embodiment, the first protrusion 23 may have any shape as long as the first protrusion 23 has the latch surface 23A perpendicular to the first axis X. For example, when viewed in the direction along the second axis Y, the first protrusion 23 may have a rectangular shape, a square shape, or a triangular shape.

In the above-described embodiment, the acute angle P formed by the first inclined surface 34A of the second protrusion 33 and the first axis X when viewed in the direction along the second axis Y is not limited to the example of the above-described embodiment. However, the acute angle P formed by the first inclined surface 34A of the second protrusion 33 and the first axis X is preferably equal to or greater than 20 degrees and equal to or less than 70 degrees. Within this angle range, the effect described in (4) above is easily obtained.

In the above-described embodiment, when viewed in the direction along the second axis Y, the acute angle P formed by the first inclined surface 34A and the first axis X, and the acute angle Q formed by the second inclined surface 34C and the first axis X may be different angles.

In the above-described embodiment, a shape of the second protrusion 33 is not limited to the example of the above-described embodiment. For example, the second protrusion 33 may be configured by a flat plate having the first inclined surface 34A, and a flat plate that connects the first inclined surface 34A to a surface of the second flat plate 31 at 90 degrees.

In the above-described embodiment, a shape of the exterior body 50 is not limited to the example of the above-described embodiment. It is sufficient that the exterior body 50 has a surface to which the lock mechanism 10 can be fixed.

In the above-described embodiment, a shape of the rack 80 is not limited to the example of the above-described embodiment. It is sufficient that the rack 80 has the first surface 91 that can be engaged with the latch surface 23A of the lock mechanism 10, and the second surface 92 that can be engaged with the bumper surface 33A.

In the above-described embodiment, the first member 81 and the second member 82 need not be separated from each other. That is, the rack 80 may be formed of one member. In this case, the gap 83 may be, for example, a through-hole. Further, in other words, the first opening may be a through-hole extending through a member, a slit cut in a member, or a space such as the gap 83. The same applies to the second opening.

REFERENCE SIGNS LIST

P ACUTE ANGLE
X FIRST AXIS
Y SECOND AXIS
10 LOCK MECHANISM
20 LATCH
21 FIRST FLAT PLATE
22 MAIN SURFACE
23 FIRST PROTRUSION
23A LATCH SURFACE

30 BUMPER
31 SECOND FLAT PLATE
33 SECOND PROTRUSION
33A BUMPER SURFACE
34A FIRST INCLINED SURFACE
50 EXTERIOR BODY
80 RACK

The invention claimed is:

1. A lock mechanism attachable to a rack-mountable exterior body for housing an electronic device, comprising:
a latch having a first flat plate and a first protrusion, the first flat plate having a main surface, and the first protrusion protrudes from the first flat plate to a side that the main surface faces; and
a bumper having a second flat plate and a second protrusion, the second flat plate being in contact with the latch, and the second protrusion protrudes from the second flat plate to a side in a same direction as the first protrusion, wherein
under conditions that a specific axis parallel to the main surface is a first axis, and an axis orthogonal to the first axis and parallel to the main surface is a second axis,
the first protrusion has a latch surface perpendicular to the first axis,
the second protrusion has a bumper surface perpendicular to the second axis
the bumper is in contact with a side of the main surface of the first flat plate, and
a bending rigidity of the bumper is smaller than a bending rigidity of the latch.

2. The lock mechanism according to claim 1,
wherein the first flat plate is fastenable through a fixing portion, the fixing portion being located on a first side of the first flat plate in a first positive direction along the first axis as viewed from the first protrusion, and
wherein an end of the first flat plate in a first negative direction opposite to the first positive direction is located on a second side of the first flat plate, the end of the first flat plate being in the first negative direction as viewed from an end of the bumper.

3. The lock mechanism according to claim 2,
wherein the second protrusion has an inclined surface facing a side to which the second protrusion protrudes,
the inclined surface is located farther on the side to which the second protrusion protrudes, as the inclined surface extends to the side in the first positive direction, and
as viewed in a direction along the second axis, an acute angle formed by the inclined surface and the first axis is equal to or greater than 20 degrees and equal to or less than 70 degrees.

4. The lock mechanism according to claim 1,
wherein the first flat plate has a side surface perpendicular to the second axis, and
the first protrusion protrudes from the side surface of the first flat plate.

5. The lock mechanism according to claim 2,
wherein the first flat plate has a side surface perpendicular to the second axis, and
the first protrusion protrudes from the side surface of the first flat plate.

6. The lock mechanism according to claim 3,
wherein the first flat plate has a side surface perpendicular to the second axis, and
the first protrusion protrudes from the side surface of the first flat plate.

7. The lock mechanism according to claim 2,
wherein the latch has two first protrusions,
the two first protrusions are separated from each other in a direction along the second axis, and
the second protrusion of the bumper is located between the two first protrusions in the direction along the second axis.

8. The lock mechanism according to claim 3,
wherein the latch has two first protrusions,
the two first protrusions are separated from each other in a direction along the second axis, and
the second protrusion of the bumper is located between the two first protrusions in the direction along the second axis.

9. The lock mechanism according to claim 4,
wherein the latch has two first protrusions,
the two first protrusions are separated from each other in a direction along the second axis, and
the second protrusion of the bumper is located between the two first protrusions in the direction along the second axis.

10. The lock mechanism according to claim 1,
wherein a minimum dimension of the second flat plate in a direction along the second axis is smaller than a minimum dimension of the first flat plate in the direction along the second axis.

11. A lock mechanism attachable to a rack-mountable exterior body for housing an electronic device, comprising:
a latch having a first flat plate and a first protrusion, the first flat plate having a main surface, and the first protrusion protrudes from the first flat plate to a side that the main surface faces; and
a bumper having a second flat plate and a second protrusion, the second flat plate being in contact with the latch, and the second protrusion protrudes from the second flat plate to a side in a same direction as the first protrusion, wherein
under conditions that a specific axis parallel to the main surface is a first axis, and an axis orthogonal to the first axis and parallel to the main surface is a second axis,
the first protrusion has a latch surface perpendicular to the first axis,
the second protrusion has a bumper surface perpendicular to the second axis,
the latch has two first protrusions,
the two first protrusions are separated from each other in a direction along the second axis, and
the second protrusion of the bumper is located between the two first protrusions in the direction along the second axis.

12. The lock mechanism according to claim 11,
wherein the bumper is in contact with a side of the main surface of the first flat plate.

13. The lock mechanism according to claim 11,
wherein the bumper is in contact with a surface of the first flat plate on a side opposite to the main surface.

14. A power supply device comprising:
a lock mechanism including
a latch having a first flat plate and a first protrusion, the first flat plate having a main surface, and the first protrusion protrudes from the first flat plate to a side that the main surface faces, and
a bumper having a second flat plate and a second protrusion, the second flat plate being in contact with the latch, and the second protrusion protrudes from the second flat plate to a side in a same direction as the first protrusion, wherein under conditions that a specific axis parallel to the main surface is a first axis, and an axis orthogonal to the first axis and parallel to the main surface is a second axis, the first protrusion has a latch surface perpendicular to the first axis, and the second protrusion has a bumper surface perpendicular to the second axis; and a rack to which an exterior body for housing an electronic device is attached via the lock mechanism, wherein the rack includes a flat plate portion that is at least partially in contact with the lock mechanism in a state where the lock mechanism is fixed, and the flat plate portion has a first surface perpendicular to the first axis, and in contact with the latch surface of the lock mechanism in the state where the lock mechanism is fixed, and a second surface perpendicular to the second axis, and in contact with the bumper surface of the lock mechanism in the state where the lock mechanism is fixed.

15. The power supply device according to claim 14, wherein the flat plate portion has a first opening extending in a direction along the second axis, and the first surface is a portion of an inner surface of the first opening.

16. The power supply device according to claim 14, wherein the flat plate portion has a second opening extending in a direction along the first axis, and the second surface is a portion of an inner surface of the second opening.

17. The power supply device according to claim 16, wherein the flat plate portion has two second surfaces, and the two second surfaces are separated from each other and face each other.

* * * * *